(12) United States Patent
Chen et al.

(10) Patent No.: US 10,573,635 B2
(45) Date of Patent: Feb. 25, 2020

(54) TRANSIENT VOLTAGE SUPPRESSION DEVICE WITH IMPROVED ELECTROSTATIC DISCHARGE (ESD) ROBUSTNESS

(71) Applicant: AMAZING MICROELECTRONIC CORP., New Taipei (TW)

(72) Inventors: Chih-Wei Chen, Taoyuan (TW); Yu-Shu Shen, Chiayi County (TW); Kun-Hsien Lin, Hsinchu (TW)

(73) Assignee: Amazing Microelectronics Corp., New Taipei (TW)

( * ) Notice: Subject to any disclaimer, the term of this patent is extended or adjusted under 35 U.S.C. 154(b) by 0 days.

(21) Appl. No.: 16/042,070

(22) Filed: Jul. 23, 2018

(65) Prior Publication Data
US 2020/0027873 A1    Jan. 23, 2020

(51) Int. Cl.
*H01L 27/02* (2006.01)
*H01L 27/082* (2006.01)
*H01L 23/60* (2006.01)
*H01L 21/761* (2006.01)
*H01L 21/762* (2006.01)

(52) U.S. Cl.
CPC .......... *H01L 27/0248* (2013.01); *H01L 23/60* (2013.01); *H01L 27/082* (2013.01); *H01L 21/761* (2013.01); *H01L 21/76224* (2013.01)

(58) Field of Classification Search
CPC ... H01L 27/0248; H01L 27/082; H01L 23/60; H01L 21/761; H01L 21/76224
USPC ........ 257/491, 510, 517, 520, 546, E21.355, 257/E21.356, E21.545, E21.572, E27.12, 257/E29.006, E29.007, E29.018, E29.03; 361/56; 438/140, 361, 380, 430, 983
See application file for complete search history.

(56) References Cited

U.S. PATENT DOCUMENTS

| | | | |
|---|---|---|---|
| 7,554,839 B2 | 6/2009 | Bobde | |
| 8,098,466 B2 | 1/2012 | Mallikarjunaswamy | |
| 8,120,887 B2 | 2/2012 | Mallikararjunaswamy et al. | |
| 8,350,355 B2 * | 1/2013 | Esmark | H01L 23/60 257/520 |
| 8,461,644 B2 | 6/2013 | Bobde | |
| 8,552,530 B2 * | 10/2013 | Lin | H01L 27/0259 257/112 |
| 9,583,586 B1 | 2/2017 | Shi et al. | |
| 9,881,914 B2 | 1/2018 | Sorgeloos et al. | |

(Continued)

*Primary Examiner* — Dao H Nguyen
(74) *Attorney, Agent, or Firm* — Rosenberg, Klein & Lee

(57) ABSTRACT

A transient voltage suppression device with improved electrostatic discharge (ESD) robustness includes a semiconductor substrate having a first conductivity type, a first doped well having a second conductivity type, a first heavily-doped area having the first conductivity type, a second doped well having the second conductivity type, a second heavily-doped area having the first conductivity type, and a first current blocking structure. The first doped well is arranged in the semiconductor substrate. The first heavily-doped area is arranged in the first doped well. The second doped well is arranged in the semiconductor substrate. The second heavily-doped area is arranged in the second doped well. The first current blocking structure is arranged in the semiconductor substrate, spaced from the bottom of the semiconductor substrate, and arranged between the first doped well and the second doped well.

22 Claims, 14 Drawing Sheets

(56) References Cited

U.S. PATENT DOCUMENTS

| | | | | |
|---|---|---|---|---|
| 2012/0012974 A1* | 1/2012 | Chuang | ............... | H01L 27/0255 257/510 |
| 2012/0241903 A1* | 9/2012 | Shen | ................... | H01L 27/0255 257/510 |
| 2013/0127007 A1* | 5/2013 | Chuang | ............... | H01L 27/0296 257/517 |
| 2017/0236816 A1* | 8/2017 | Tsai | .................... | H01L 27/0255 257/112 |

* cited by examiner

TRANSIENT VOLTAGE SUPPRESSION DEVICE WITH IMPROVED ELECTROSTATIC DISCHARGE (ESD) ROBUSTNESS

BACKGROUND OF THE INVENTION

Field of the Invention

The present invention relates to a suppression device, particularly to a transient voltage suppression device with improved electrostatic discharge (ESD) robustness.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages. The working principle of TVS is shown in FIG. 1. In FIG. 1, the TVS device 10 is connected in parallel with the protected circuit 12 on the printed circuit board (PCB). The TVS device 10 would be triggered immediately when the ESD event occurs. In that way, the TVS device 10 can provide a superiorly low resistance path for discharging the transient ESD current, so that the energy of the ESD transient current can be bypassed by the TVS device 10.

As shown in FIG. 2, the conventional transient voltage suppression device includes an N-type substrate 14, two P-type doped wells 16, and two N-type heavily-doped areas 18. The P-type doped wells 16 are formed in the N-type substrate 14. The N-type heavily-doped areas 18 are formed in the P-type doped wells 16. The transient voltage suppression device has a discharging path. The discharging path is formed by the N-type substrate 14, the P-type doped wells 16, and two of the N-type heavily-doped areas 18. Since the ESD current flows along the shortest path, the abovementioned paths are close to the upper surface of the N-type substrate 14. Thus, the heat generated by the ESD current is concentrated on the upper surface of the N-type substrate 14, thereby reducing the ESD robustness.

To overcome the abovementioned problems, the present invention provides a transient voltage suppression device with improved ESD robustness, so as to solve the aforementioned problems of the prior art.

SUMMARY OF THE INVENTION

A primary objective of the present invention is to provide a transient voltage suppression device with improved electrostatic discharge (ESD) robustness, which uses a first current blocking structure to suppress a parasitic bipolar junction transistor, thereby enhancing the electrostatic discharge (ESD) robustness.

To achieve the abovementioned objectives, the present invention provides a transient voltage suppression device with improved electrostatic discharge (ESD) robustness, which comprises a semiconductor substrate having a first conductivity type, a first doped well having a second conductivity type, a first heavily-doped area having the first conductivity type, a second doped well having the second conductivity type, a second heavily-doped area having the first conductivity type, and a first current blocking structure. The first doped well is arranged in the semiconductor substrate and spaced from the bottom of the semiconductor substrate. The first heavily-doped area is arranged in the first doped well. The second doped well is arranged in the semiconductor substrate and spaced from the bottom of the semiconductor substrate. The second heavily-doped area is arranged in the second doped well. The first current blocking structure is arranged in the semiconductor substrate, spaced from the bottom of the semiconductor substrate, and arranged between the first doped well and the second doped well. The depth of the first current blocking structure is deeper than or equal to the depths of the first doped well and the second doped well.

In an embodiment of the present invention, the first conductivity type is a P type and the second conductivity type is an N type.

In an embodiment of the present invention, the first conductivity type is an N type and the second conductivity type is a P type.

In an embodiment of the present invention, the first current blocking structure is a heavily-doped well having the first conductivity type or an isolation trench.

In an embodiment of the present invention, the transient voltage suppression device further comprises a third heavily-doped area having the first conductivity type and a fourth heavily-doped area having the first conductivity type. The third heavily-doped area is arranged in the first doped well. The fourth heavily-doped area is arranged in the second doped well, the fourth heavily-doped area is electrically connected to the third heavily-doped area, and the first heavily-doped area and the second heavily-doped area are respectively electrically connected to a first pin and a second pin.

In an embodiment of the present invention, the transient voltage suppression device further comprises at least one third doped well arranged in the semiconductor substrate, spaced from the bottom of the semiconductor substrate, and arranged between the first current blocking structure and the first doped well, the depth of the first current blocking structure is deeper than or equal to the depth of the at least one third well, the at least one third doped well has the second conductivity type and has a fifth heavily-doped area and a sixth heavily-doped area, the fifth heavily-doped area and the sixth heavily-doped area have the first conductivity type, and the third heavily-doped area is electrically connected to the fourth heavily-doped area through the fifth heavily-doped area and the sixth heavily-doped area.

In an embodiment of the present invention, the transient voltage suppression device comprises at least one second current blocking structure arranged in the semiconductor substrate, spaced from the bottom of the semiconductor substrate, and arranged between the first doped well and the at least one third doped well, and the depth of the at least one second current blocking structure is deeper than or equal to the depths of the first doped well, the second doped well, and the at least one third doped well.

In an embodiment of the present invention, the at least one second current blocking structure is a heavily-doped well having the first conductivity type or an isolation trench.

In an embodiment of the present invention, the transient voltage suppression device further comprises at least one fourth doped well arranged in the semiconductor substrate, spaced from the bottom of the semiconductor substrate, and arranged between the first current blocking structure and the second doped well, the depth of the first current blocking structure is deeper than or equal to the depth of the at least one fourth well, the at least one fourth doped well has the second conductivity type and has a seventh heavily-doped area and an eighth heavily-doped area, the seventh heavily-doped area and the eighth heavily-doped area have the first conductivity type, and the third heavily-doped area is electrically connected to the fourth heavily-doped area through the seventh heavily-doped area and the eighth heavily-doped area.

In an embodiment of the present invention, the transient voltage suppression device further comprises at least one third current blocking structure arranged in the semiconductor substrate, spaced from the bottom of the semiconductor substrate, and arranged between the second doped well and the at least one fourth doped well, and a depth of the at least one third current blocking structure is deeper than or equal to the depths of the first doped well, the second doped well, and the at least one fourth doped well.

In an embodiment of the present invention, the at least one third current blocking structure is a heavily-doped well having the first conductivity type or an isolation trench.

The present invention also provides a transient voltage suppression device with improved electrostatic discharge (ESD) robustness, which comprises a semiconductor substrate having a first conductivity type, an epitaxial layer, a first doped well having a second conductivity type, a first heavily-doped area having the first conductivity type, a second doped well having the second conductivity type, a second heavily-doped area having the first conductivity type, and a first current blocking structure. The epitaxial layer is arranged on the semiconductor substrate. The first doped well is arranged in the epitaxial layer. The first heavily-doped area is arranged in the first doped well. The second doped well is arranged in the epitaxial layer. The second heavily-doped area is arranged in the second doped well. The first current blocking structure is arranged in the epitaxial layer and arranged between the first doped well and the second doped well. The depth of the first current blocking structure is deeper than or equal to the depths of the first doped well and the second doped well In an embodiment of the present invention, the first conductivity type is a P type and the second conductivity type is an N type.

In an embodiment of the present invention, the first conductivity type is an N type and the second conductivity type is a P type.

In an embodiment of the present invention, the first current blocking structure is a heavily-doped well having the first conductivity type or an isolation trench.

In an embodiment of the present invention, the transient voltage suppression device further comprises a third heavily-doped area having the first conductivity type and a fourth heavily-doped area having the first conductivity type. The third heavily-doped area is arranged in the first doped well. The fourth heavily-doped area is arranged in the second doped well, the fourth heavily-doped area is electrically connected to the third heavily-doped area, and the first heavily-doped area and the second heavily-doped area are respectively electrically connected to a first pin and a second pin.

In an embodiment of the present invention, the transient voltage suppression device further comprises at least one third doped well arranged in the epitaxial layer and arranged between the first current blocking structure and the first doped well, the depth of the first current blocking structure is deeper than or equal to the depth of the at least one third well, the at least one third doped well has the second conductivity type and has a fifth heavily-doped area and a sixth heavily-doped area, the fifth heavily-doped area and the sixth heavily-doped area have the first conductivity type, and the third heavily-doped area is electrically connected to the fourth heavily-doped area through the fifth heavily-doped area and the sixth heavily-doped area.

In an embodiment of the present invention, the transient voltage suppression device further comprises at least one second current blocking structure arranged in the epitaxial layer and arranged between the first doped well and the at least one third doped well, and a depth of the at least one second current blocking structure is deeper than or equal to the depths of the first doped well, the second doped well, and the at least one third doped well.

In an embodiment of the present invention, the at least one second current blocking structure is a heavily-doped well having the first conductivity type or an isolation trench.

In an embodiment of the present invention, the transient voltage suppression device further comprises at least one fourth doped well arranged in the epitaxial layer and arranged between the first current blocking structure and the second doped well, the depth of the first current blocking structure is deeper than or equal to the depth of the at least one fourth well, the at least one fourth doped well has the second conductivity type and has a seventh heavily-doped area and an eighth heavily-doped area, the seventh heavily-doped area and the eighth heavily-doped area have the first conductivity type, and the third heavily-doped area is electrically connected to the fourth heavily-doped area through the seventh heavily-doped area and the eighth heavily-doped area.

In an embodiment of the present invention, the transient voltage suppression device further comprises at least one third current blocking structure arranged in the epitaxial layer and arranged between the second doped well and the at least one fourth doped well, and a depth of the at least one third current blocking structure is deeper than or equal to the depths of the first doped well, the second doped well, and the at least one fourth doped well.

In an embodiment of the present invention, the at least one third current blocking structure is a heavily-doped well having the first conductivity type or an isolation trench.

Below, the embodiments are described in detail in cooperation with the drawings to make easily understood the technical contents, characteristics and accomplishments of the present invention.

DETAILED DESCRIPTION OF THE INVENTION

Figure 1:
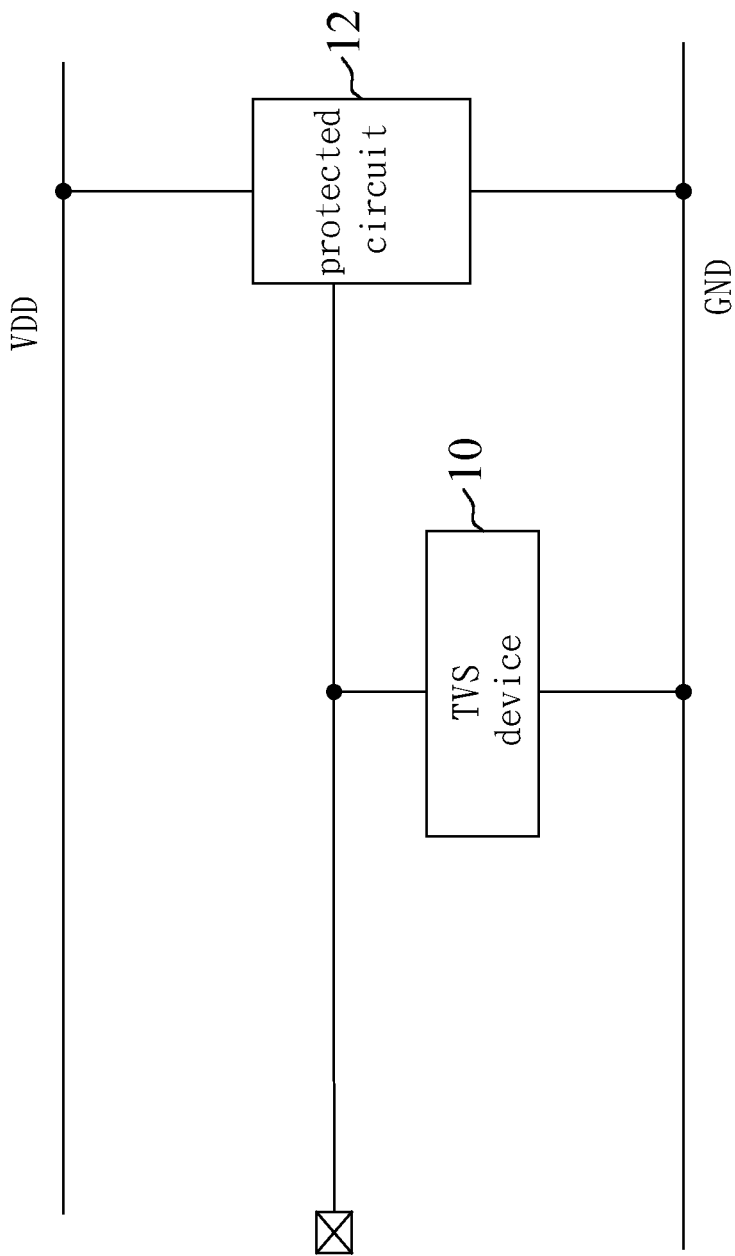
FIG. 1 is a schematic diagram illustrating a transient voltage suppressor (TVS) connected with a protected circuit in the conventional technology.
Figure 2:
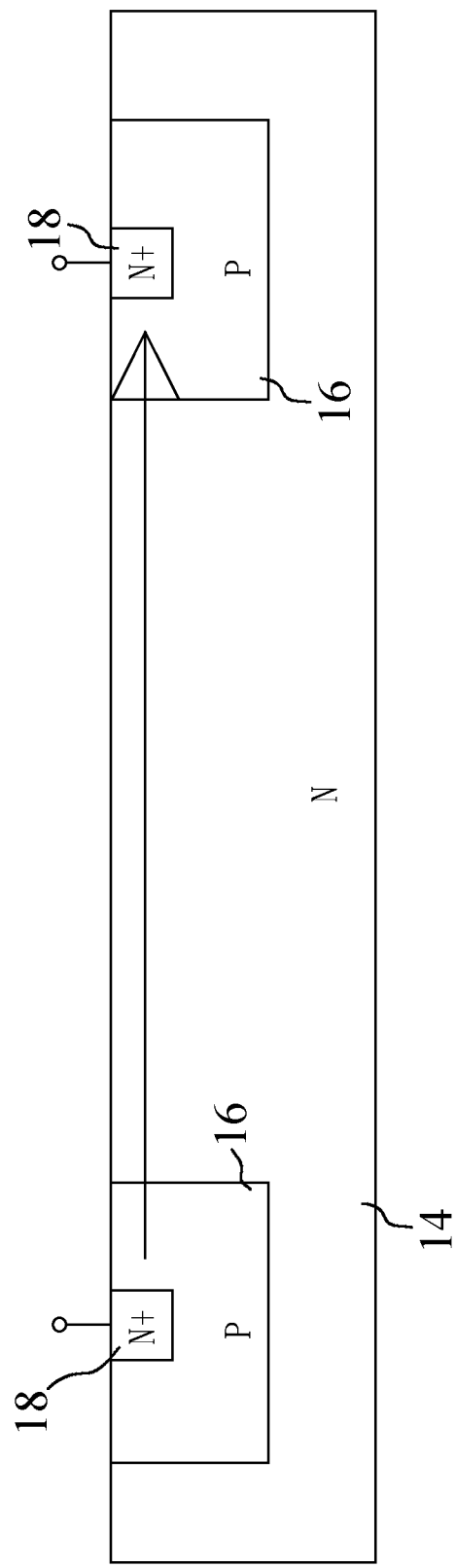
FIG. 2 is a cross-sectional view of a transient voltage suppression device in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 3:
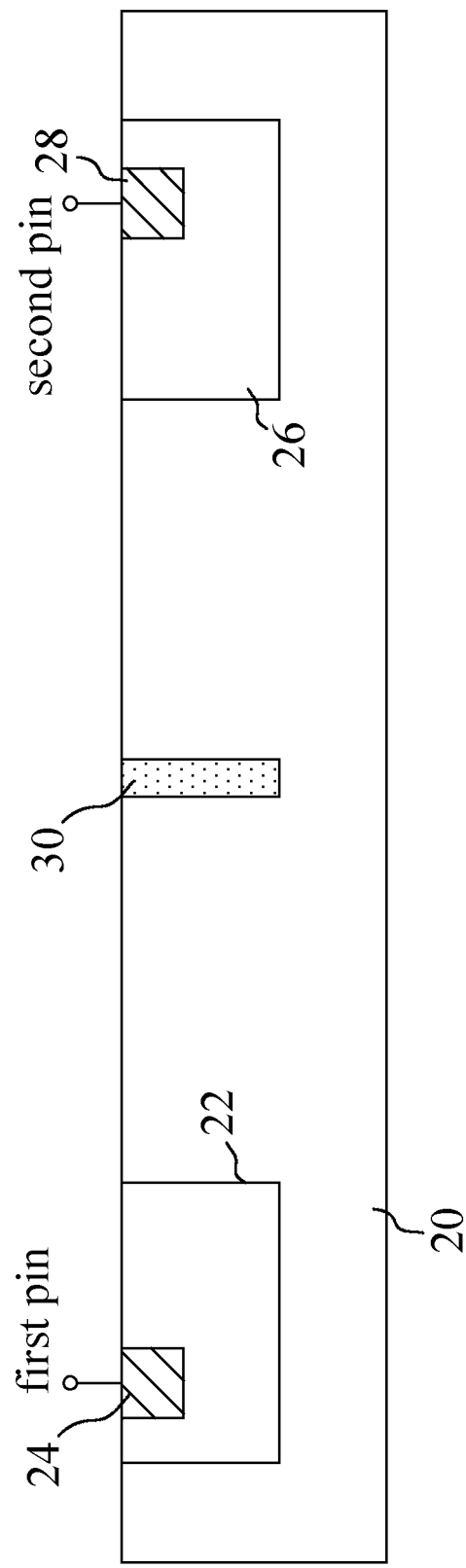
FIG. 3 is a cross-sectional view of a transient voltage suppression device with improved electrostatic discharge (ESD) robustness according to the first embodiment of the present invention.

Refer to FIG. 3. The first embodiment of the transient voltage suppression device with improved electrostatic discharge (ESD) robustness of the present invention is introduced as below. The first embodiment comprises a semiconductor substrate 20 having a first conductivity type, a first doped well 22 having a second conductivity type, a first heavily-doped area 24 having the first conductivity type, a second doped well 26 having the second conductivity type, a second heavily-doped area 28 having the first conductivity type, and a first current blocking structure 30, wherein the first current blocking structure 30 may be a heavily-doped well having the first conductivity type or an isolation trench made of insulation material. The first doped well 22 is arranged in the semiconductor substrate 20 and spaced from the bottom of the semiconductor substrate 20. The first heavily-doped area 24 is arranged in the first doped well 22. The second doped well 26 is arranged in the semiconductor substrate 20 and spaced from the bottom of the semiconductor substrate 20. The second heavily-doped area 28 is arranged in the second doped well 26. The first heavily-doped area 24 and the second heavily-doped area 28 are respectively electrically connected to a first pin and a second pin. The first current blocking structure 30 is arranged in the semiconductor substrate 20, spaced from the bottom of the semiconductor substrate 20, and arranged between the first doped well 22 and the second doped well 26. The depth of the first current blocking structure 30 is deeper than or equal to the depths of the first doped well 22 and the second doped well 26.

Figure 4:
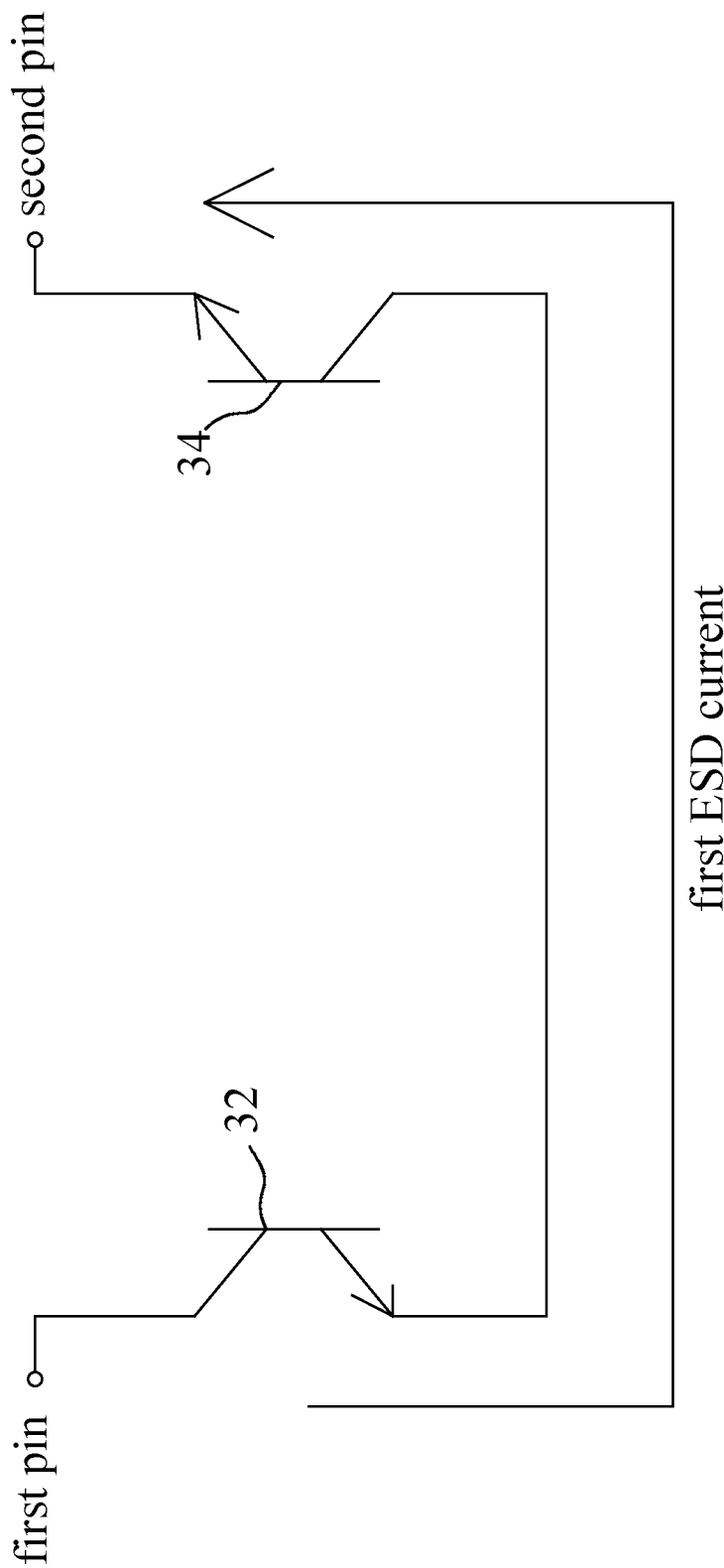
FIG. 4 is a diagram showing an equivalent circuit of FIG. 3.

The first embodiment of the transient voltage suppression device of the present invention is a bidirectional electrostatic discharge (ESD) protection circuit. When the first conductivity type is an N type, the second conductivity type is a P type. In such a case, the equivalent circuit of FIG. 3 is shown in FIG. 4. The semiconductor substrate 20, the first doped well 22, and the first heavily-doped area 24 form an NPN bipolar junction transistor (BJT) 32. The semiconductor substrate 20, the second doped well 26, and the second heavily-doped area 28 form an NPN BJT 34. The NPN BJT 32 is electrically connected to the NPN BJT 34 in series for high voltage applications. The NPN BJT 32 and the NPN BJT 34 are isolated by the first current blocking structure 30. When the first current blocking structure 30 is an isolation trench made of insulation material, the first ESD current will flow through the semiconductor substrate 20 under the first current blocking structure 30. When the first current blocking structure 30 is an N-type heavily-doped area, the first current blocking structure 30, the first doped well 22, and the second doped well 26 form a parasitic PNP BJT. Since the base concentration of the parasitic PNP BJT is high, the β gain of the parasitic PNP BJT is low. Thus, the current flowing through the parasitic PNP BJT is low. In other words, the first ESD current also flows through the semiconductor substrate 20 under the first current blocking structure 30. Since the position that the first ESD current flows through is distant from the upper surface of the semiconductor substrate 20, the heat produced by the first ESD current is dispersed in the semiconductor substrate 20 to enhance the ESD robustness. Besides, the breakdown voltage of each of the NPN BJT 32 and the NPN BJT 34 is changed by the doping concentration of the first doped well 22 and the second doped well 26.

Figure 5:
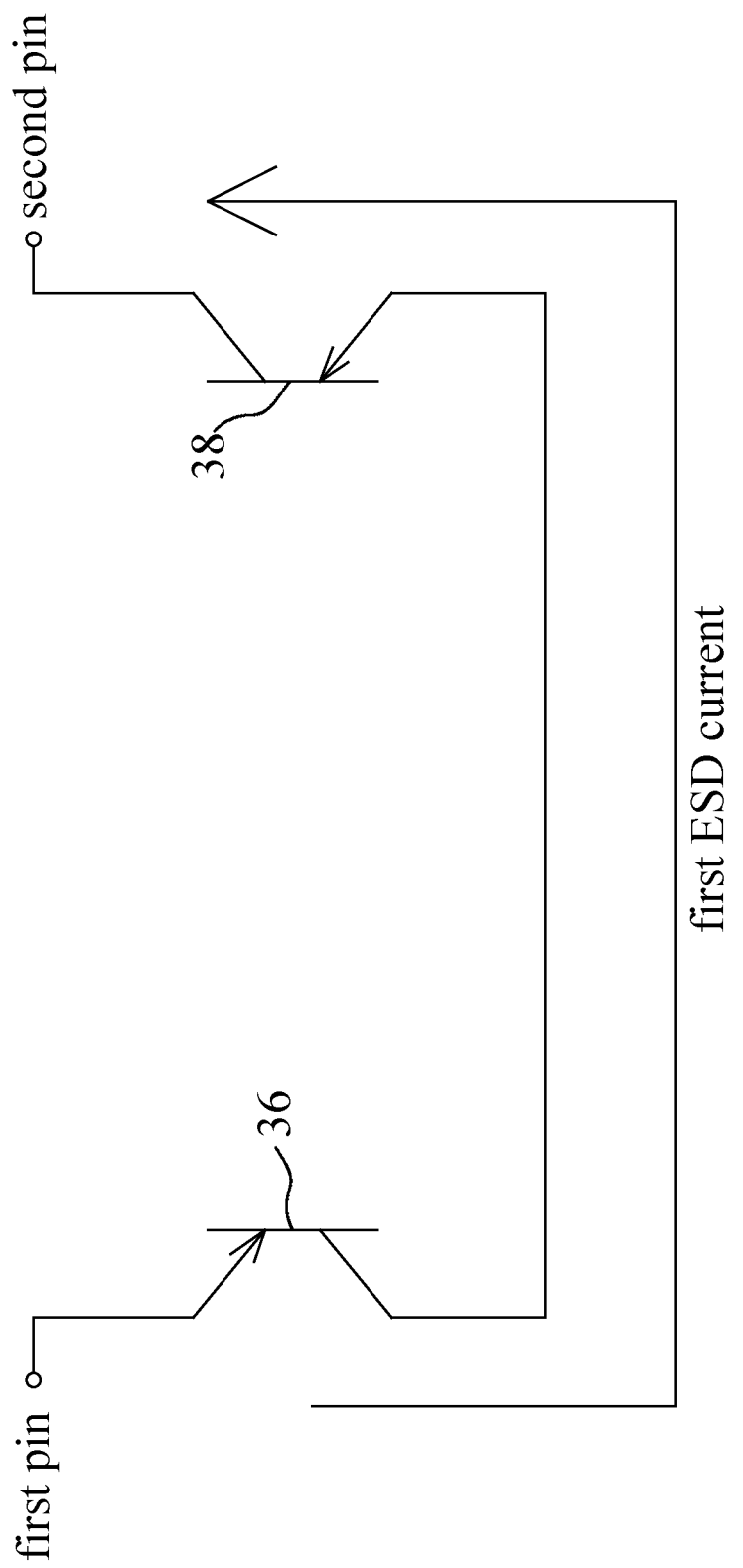
FIG. 5 is a diagram showing another equivalent circuit of FIG. 3.

When the first conductivity type is a P type, the second conductivity type is an N type. In such a case, the equivalent circuit of FIG. 3 is shown in FIG. 5. The semiconductor substrate 20, the first doped well 22, and the first heavily-doped area 24 form a PNP bipolar junction transistor (BJT) 36. The semiconductor substrate 20, the second doped well 26, and the second heavily-doped area 28 form a PNP BJT 38. The PNP BJT 36 is electrically connected to the PNP BJT 38 in series for high voltage applications. The PNP BJT 36 and the PNP BJT 38 are isolated by the first current blocking structure 30. When the first current blocking structure 30 is an isolation trench made of insulation material, the first ESD current will flow through the semiconductor substrate 20 under the first current blocking structure 30. When the first current blocking structure 30 is a P-type heavily-doped area, the first current blocking structure 30, the first doped well 22, and the second doped well 26 form a parasitic NPN BJT. Since the base concentration of the parasitic NPN BJT is high, the β gain of the parasitic NPN BJT is low. Thus, the current flowing through the parasitic NPN BJT is low. In other words, the first ESD current also flows through the semiconductor substrate 20 under the first current blocking structure 30. Since the position that the first ESD current flows through is distant from the upper surface of the semiconductor substrate 20, the heat produced by the first ESD current is dispersed in the semiconductor substrate 20 to enhance the ESD robustness. Besides, the breakdown voltage of each of the PNP BJT 36 and the PNP BJT 38 is changed by the doping concentration of the first doped well 22 and the second doped well 26.

Figure 6:
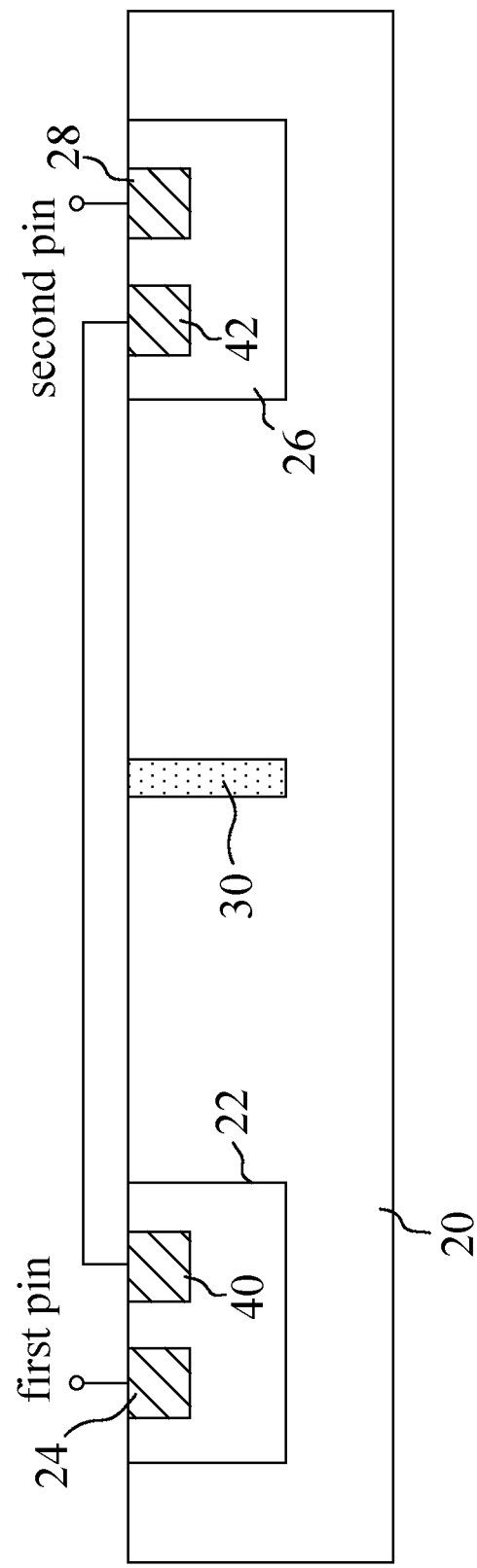
FIG. 6 is a cross-sectional view of a transient voltage suppression device with improved electrostatic discharge (ESD) robustness according to the second embodiment of the present invention.

Refer to FIG. 6. The second embodiment of the transient voltage suppression device with improved ESD robustness of the present invention is introduced as below. The second embodiment is different from the first embodiment in that the second embodiment further comprises a third heavily-doped area 40 having the first conductivity type and a fourth heavily-doped area 42 having the first conductivity type. The third heavily-doped area 40 is arranged in the first doped well 22. The fourth heavily-doped area 42 is arranged in the second doped well 26. The fourth heavily-doped area 42 is electrically connected to the third heavily-doped area 40.

Figure 7:
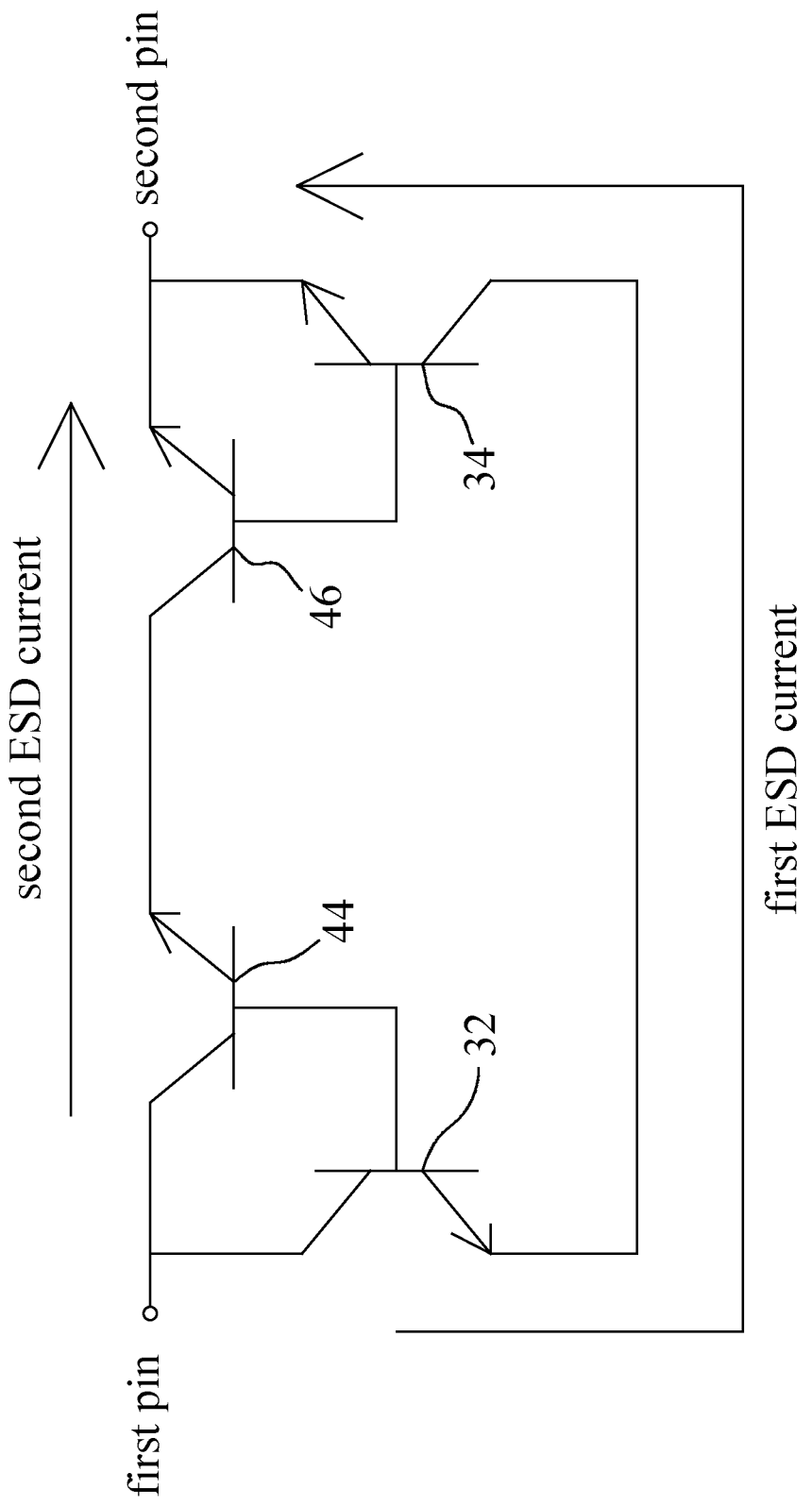
FIG. 7 is a diagram showing an equivalent circuit of FIG. 6.

The second embodiment of the transient voltage suppression device of the present invention is also a bidirectional ESD protection circuit. When the first conductivity type is an N type, the second conductivity type is a P type. In such a case, the equivalent circuit of FIG. 6 is shown in FIG. 7. Refer to FIG. 4, FIG. 6, and FIG. 7. The first doped well 22, the first heavily-doped area 24, and the third heavily-doped area 40 form an NPN bipolar junction transistor (BJT) 44. The second doped well 26, the second heavily-doped area 28, and the fourth heavily-doped area 42 form an NPN BJT 46. The NPN BJT 44 is electrically connected to the NPN BJT 46 in series for high voltage applications. Besides, the breakdown voltage of each of the NPN BJT 44 and the NPN BJT 46 is changed by the doping concentration of the first doped well 22 and the second doped well 26. The second ESD current may flow through the third heavily-doped area 40 and the fourth heavily-doped area 42. The breakdown voltage causing the second ESD current is lower than the breakdown voltage causing the first ESD current since the path that the first ESD current flows is longer than the path that the second ESD current flows.

Figure 8:
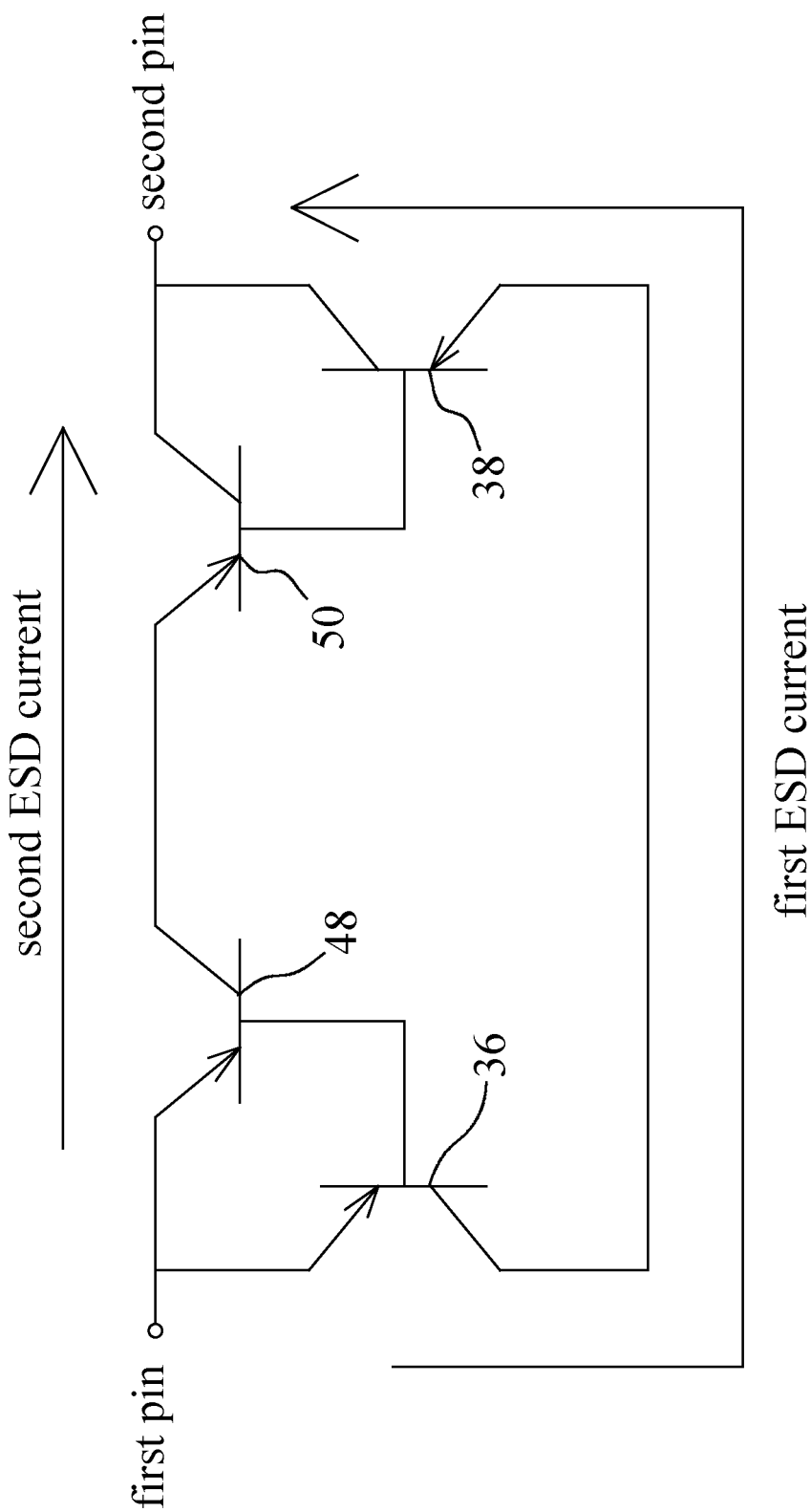
FIG. 8 is a diagram showing another equivalent circuit of FIG. 6.

When the first conductivity type is a P type, the second conductivity type is an N type. In such a case, the equivalent circuit of FIG. 6 is shown in FIG. 8. Refer to FIG. 5, FIG. 6, and FIG. 8. The first doped well 22, the first heavily-doped area 24, and the third heavily-doped area 40 form a PNP bipolar junction transistor (BJT) 48. The second doped well 26, the second heavily-doped area 28, and the fourth heavily-doped area 42 form a PNP BJT 50. The PNP BJT 48 is electrically connected to the PNP BJT 50 in series for high voltage applications. Besides, the breakdown voltage of each of the PNP BJT 48 and the PNP BJT 50 is changed by the doping concentration of the first doped well 22 and the second doped well 26. The second ESD current may flow through the third heavily-doped area 40 and the fourth heavily-doped area 42. The breakdown voltage causing the second ESD current is lower than the breakdown voltage causing the first ESD current since the path that the first ESD current flows is longer than the path that the second ESD current flows.

Figure 9:
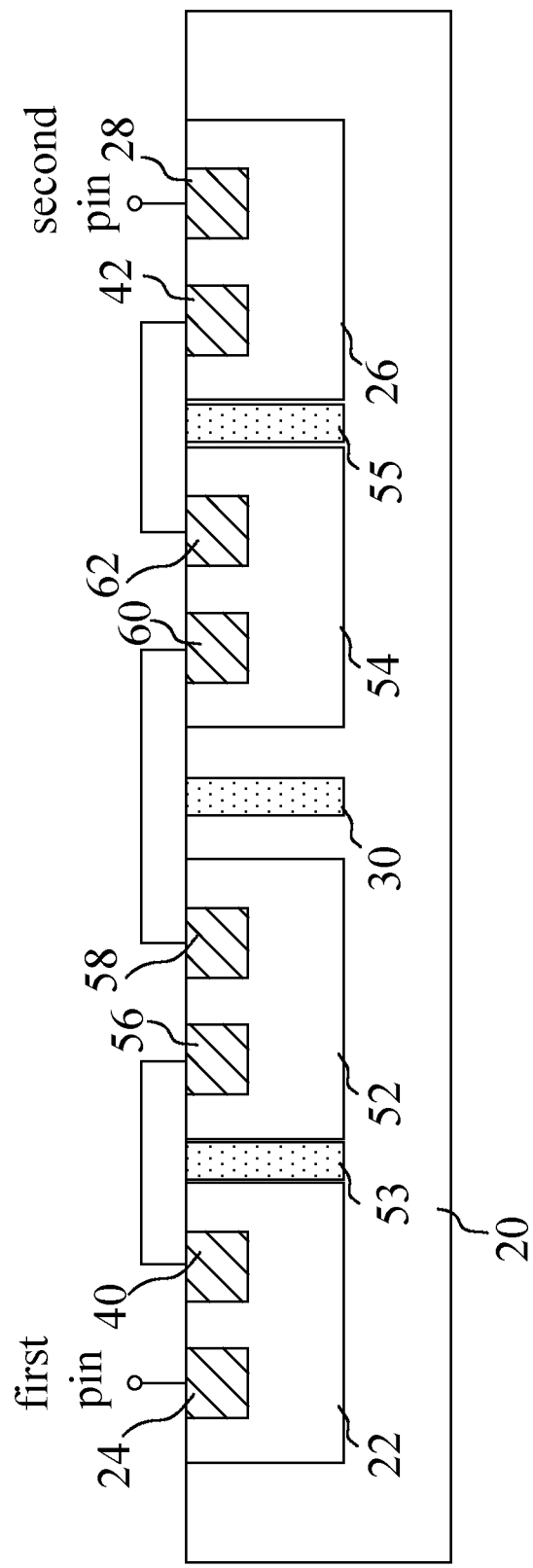
FIG. 9 is a cross-sectional view of a transient voltage suppression device with improved electrostatic discharge (ESD) robustness according to the third embodiment of the present invention.

Refer to FIG. 9. The third embodiment of the transient voltage suppression device with improved ESD robustness of the present invention is introduced as below. The third embodiment is different from the second embodiment in that the third embodiment further comprises at least one third doped well 52, at least one second current blocking structure 53, at least one fourth doped well 54, and at least one third current blocking structure 55, wherein the at least one second current blocking structure 53 may be a heavily-doped well having the first conductivity type or an isolation trench made of insulation material, and the at least one third current blocking structure 55 may be a heavily-doped well having the first conductivity type or an isolation trench made of insulation material. The functions of the at least one second current blocking structure 53 and the at least one third current blocking structure 55 are the same to the function of the first current blocking structure 30. The at least one second current blocking structure 53 and the at least one third current blocking structure 55 are used to block the ESD current to flow. The at least one third doped well 52 is arranged in the semiconductor substrate 20, spaced from the bottom of the semiconductor substrate 20, and arranged between the first current blocking structure 30 and the first doped well 22, the depth of the first current blocking structure 30 is deeper than or equal to the depth of the at least one third well 52, the at least one third doped well 52 has the second conductivity type and has a fifth heavily-doped area 56 and a sixth heavily-doped area 58, the fifth heavily-doped area 56 and the sixth heavily-doped area 58 have the first conductivity type, and the third heavily-doped area 40 is electrically connected to the fourth heavily-doped area 42 through the fifth heavily-doped area 56 and the sixth heavily-doped area 58. The at least one second current blocking structure 53 is arranged in the semiconductor substrate 20, spaced from the bottom of the semiconductor substrate 20, and arranged between the first doped well 22 and the at least one third doped well 52, and the depth of the at least one second current blocking structure 53 is deeper than or equal to the depths of the first doped well 22, the second doped well 26, and the at least one third doped well 52. The at least one fourth doped well 54 is arranged in the semiconductor substrate 20, spaced from the bottom of the semiconductor substrate 20, and arranged between the first current blocking structure 30 and the second doped well 26, the depth of the first current blocking structure 30 is deeper than or equal to the depth of the at least one fourth well 54, the at least one fourth doped well 54 has the second conductivity type and has a seventh heavily-doped area 60 and an eighth heavily-doped area 62, the seventh heavily-doped area 60 and the eighth heavily-doped area 62 have the first conductivity type, and the third heavily-doped area 40 is electrically connected to the fourth heavily-doped area 42 through the fifth heavily-doped area 56, the sixth heavily-doped area 58, the seventh heavily-doped area 60, and the eighth heavily-doped area 62. The at least one third current blocking structure 55 is arranged in the semiconductor substrate 20, spaced from the bottom of the semiconductor substrate 20, and arranged between the second doped well 26 and the at least one fourth doped well 54, and the depth of the at least one third current blocking structure 55 is deeper than or equal to the depths of the first doped well 22, the second doped well 26, the at least one third doped well 52, and the at least one fourth doped well 54.

Figure 10:
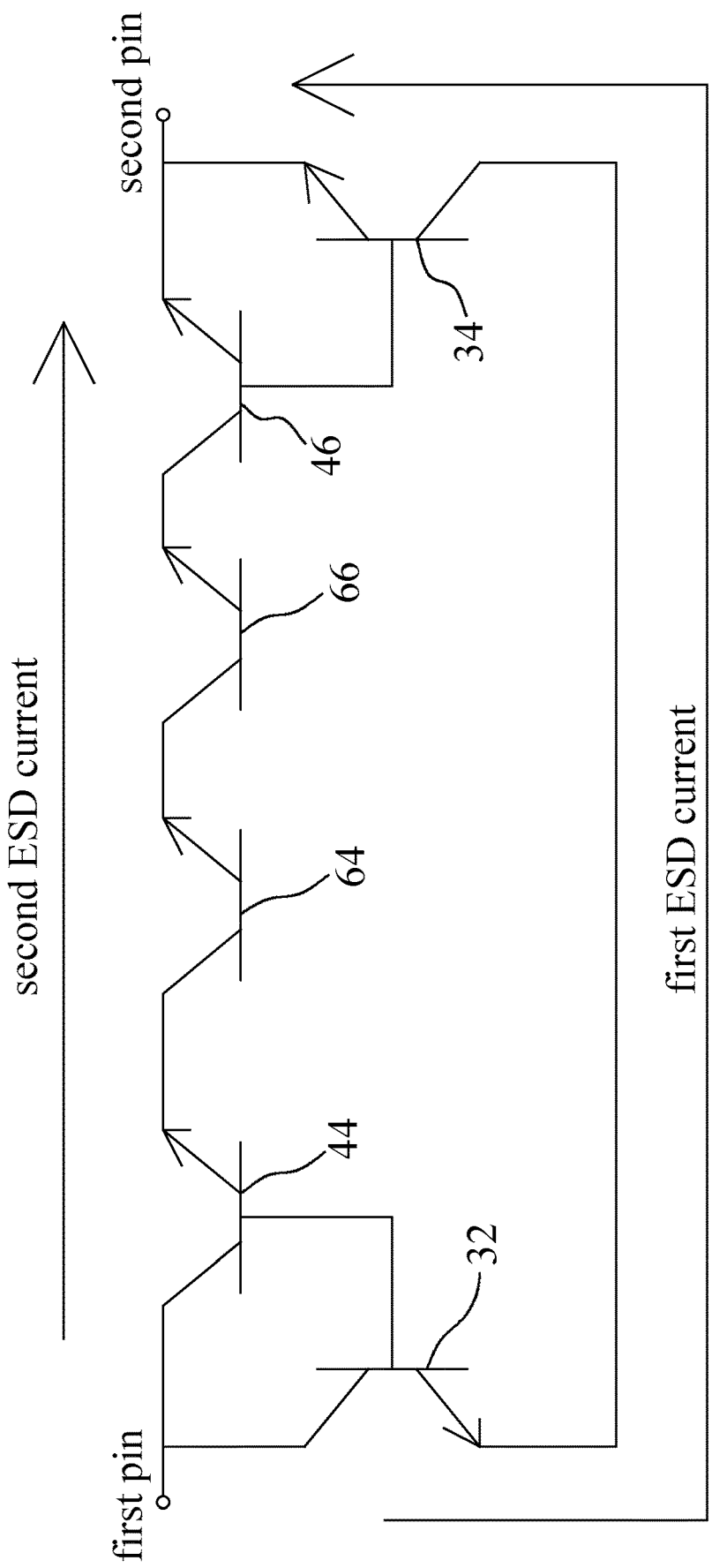
FIG. 10 is a diagram showing an equivalent circuit of FIG. 9.

The third embodiment of the transient voltage suppression device of the present invention is also a bidirectional ESD protection circuit. When the first conductivity type is an N type, the second conductivity type is a P type. In such a case, the equivalent circuit of FIG. 9 is shown in FIG. 10. Refer to FIG. 7, FIG. 9, and FIG. 10. The fifth heavily-doped area 56, the third doped well 52, and the sixth heavily-doped area 58 form an NPN bipolar junction transistor (BJT) 64. The seventh heavily-doped area 60, the fourth doped well 54, and the eighth heavily-doped area 62 form an NPN BJT 66. The NPN BJTs 64 and 66 are electrically connected to the NPN BJTs 44 and 46 in series for high voltage applications. Besides, the breakdown voltage of each of the NPN BJT 64 and the NPN BJT 66 is changed by the doping concentration of the third doped well 52 and the fourth doped well 54. The second ESD current may flow through the third heavily-doped area 40, the fifth heavily-doped area 56, the sixth heavily-doped area 58, the seventh heavily-doped area 60, the eighth heavily-doped area 62, and the fourth heavily-doped area 42. The breakdown voltage causing the second ESD current depends on the number of the NPN BJTs 64 and 66. The breakdown voltage causing the second ESD current is lower than the breakdown voltage causing the first ESD current since the path that the first ESD current flows is longer than the path that the second ESD current flows.

Figure 11:
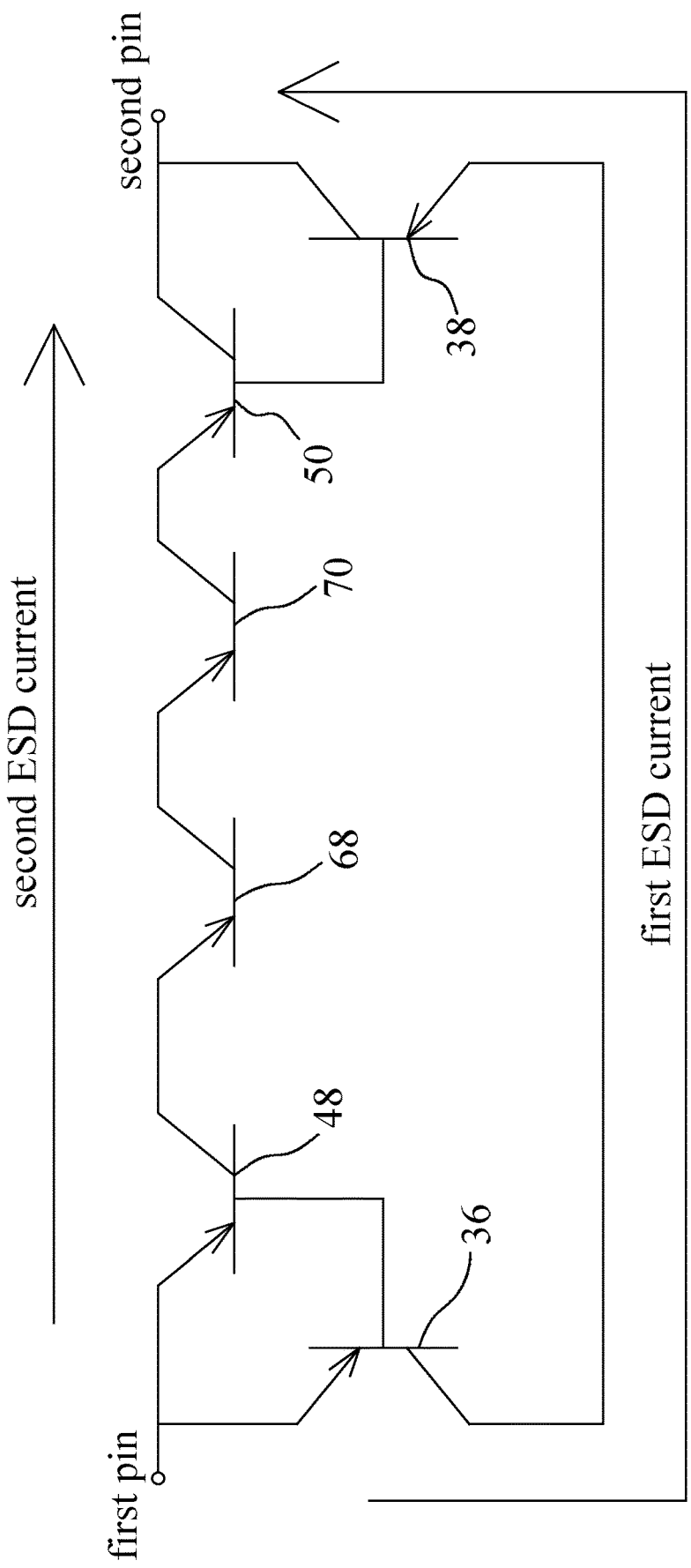
FIG. 11 is a diagram showing another equivalent circuit of FIG. 9.

When the first conductivity type is a P type, the second conductivity type is an N type. In such a case, the equivalent circuit of FIG. 9 is shown in FIG. 11. Refer to FIG. 8, FIG. 9, and FIG. 11. The fifth heavily-doped area 56, the third doped well 52, and the sixth heavily-doped area 58 form a PNP bipolar junction transistor (BJT) 68. The seventh heavily-doped area 60, the fourth doped well 54, and the eighth heavily-doped area 62 form a PNP BJT 70. The PNP BJTs 68 and 70 are electrically connected to the PNP BJTs 48 and 50 in series for high voltage applications. Besides, the breakdown voltage of each of the PNP BJT 68 and the PNP BJT 70 is changed by the doping concentration of the third doped well 52 and the fourth doped well 54. The second ESD current may flow through the third heavily-doped area 40, the fifth heavily-doped area 56, the sixth heavily-doped area 58, the seventh heavily-doped area 60, the eighth heavily-doped area 62, and the fourth heavily-doped area 42. The breakdown voltage causing the second ESD current depends on the number of the PNP BJTs 68 and 70. The breakdown voltage causing the second ESD current is lower than the breakdown voltage causing the first ESD current since the path that the first ESD current flows is longer than the path that the second ESD current flows.

Figure 12:
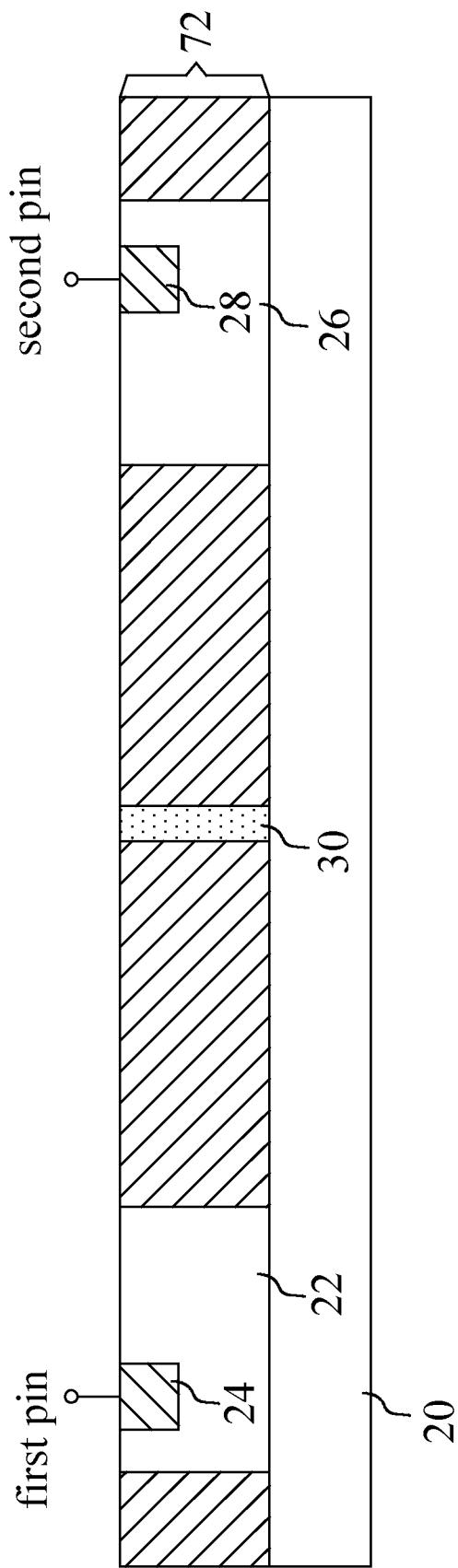
FIG. 12 is a cross-sectional view of a transient voltage suppression device with improved electrostatic discharge (ESD) robustness according to the fourth embodiment of the present invention.

Refer to FIG. 12. The fourth embodiment of the transient voltage suppression device with improved ESD robustness of the present invention is introduced as below. The fourth embodiment is different from the first embodiment in that the first doped well 22, the second doped well 26, and the first current blocking structure 30 are arranged in an epitaxial layer 72 that is arranged on the semiconductor substrate 20. In the fourth embodiment, the first doped well 22, the second doped well 26, and the first current blocking structure 30 may contact the semiconductor substrate 20. When the first conductivity type is an N type, the second conductivity type is a P type. In such a case, the equivalent circuit of FIG. 12 is shown in FIG. 4. Even when the epitaxial layer 72 is an N type, P type, or intrinsic and the first doped well 22 and the second doped well 26 are spaced from the semiconductor substrate 20, the semiconductor substrate 20, the epitaxial layer 72, the first doped well 22, and the first heavily-doped area 24 still form the NPN BJT 32 and the semiconductor substrate 20, the epitaxial layer 72, the second doped well 26, and the second heavily-doped area 28 form the NPN BJT 34. When the first conductivity type is a P type, the second conductivity type is an N type. In such a case, the equivalent circuit of FIG. 12 is shown in FIG. 5. Even when the epitaxial layer 72 is an N type, P type, or intrinsic and the first doped well 22 and the second doped well 26 are spaced from the semiconductor substrate 20, the semiconductor substrate 20, the epitaxial layer 72, the first doped well 22, and the first heavily-doped area 24 still form the PNP BJT 36 and the semiconductor substrate 20, the epitaxial layer 72, the second doped well 26, and the second heavily-doped area 28 form the PNP BJT 38. The other technical features have been described previously so will not be reiterated.

Figure 13:
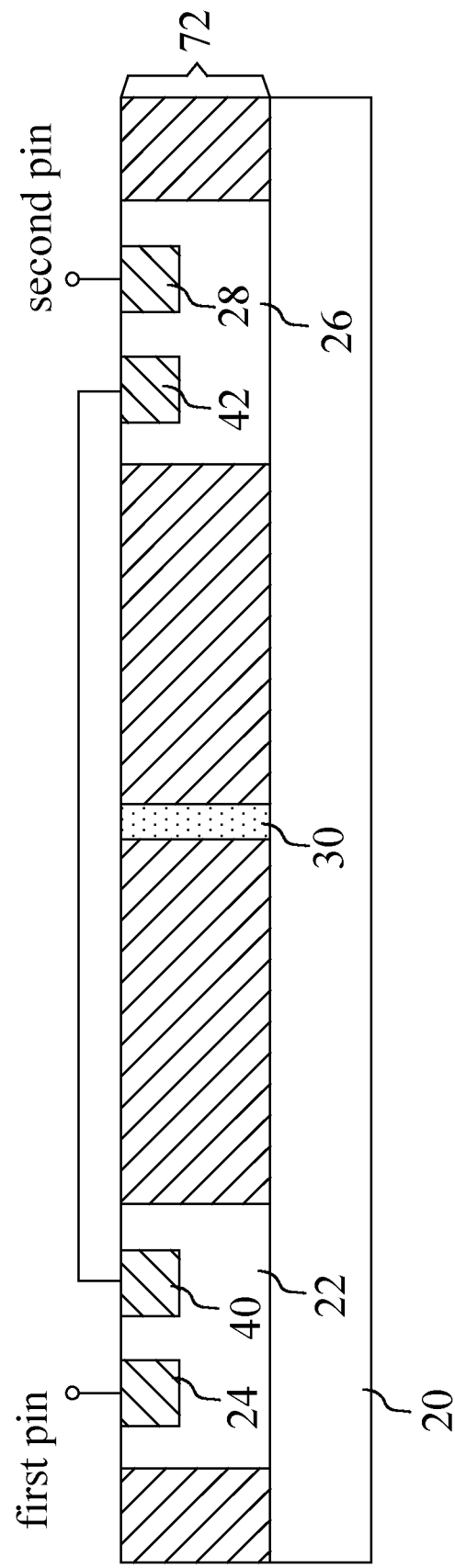
FIG. 13 is a cross-sectional view of a transient voltage suppression device with improved electrostatic discharge (ESD) robustness according to the fifth embodiment of the present invention.

Refer to FIG. 13. The fifth embodiment of the transient voltage suppression device with improved ESD robustness of the present invention is introduced as below. The fifth embodiment is different from the second embodiment in that the first doped well 22, the second doped well 26, and the first current blocking structure 30 are arranged in an epitaxial layer 72 that is arranged on the semiconductor substrate 20. In the fifth embodiment, the first doped well 22, the second doped well 26, and the first current blocking structure 30 may contact the semiconductor substrate 20. When the first conductivity type is an N type, the second conductivity type is a P type. In such a case, the equivalent circuit of FIG. 13 is shown in FIG. 7. Even when the epitaxial layer 72 is an N type, P type, or intrinsic and the first doped well 22 and the second doped well 26 are spaced from the semiconductor substrate 20, the semiconductor substrate 20, the epitaxial layer 72, the first doped well 22, and the first heavily-doped area 24 still form the NPN BJT 32 and the semiconductor substrate 20, the epitaxial layer 72, the second doped well 26, and the second heavily-doped area 28 form the NPN BJT 34. When the first conductivity type is a P type, the second conductivity type is an N type. In such a case, the equivalent circuit of FIG. 13 is shown in FIG. 8. Even when the epitaxial layer 72 is an N type, P type, or intrinsic and the first doped well 22 and the second doped well 26 are spaced from the semiconductor substrate 20, the semiconductor substrate 20, the epitaxial layer 72, the first doped well 22, and the first heavily-doped area 24 still form the PNP BJT 36 and the semiconductor substrate 20, the epitaxial layer 72, the second doped well 26, and the second heavily-doped area 28 form the PNP BJT 38. The other technical features have been described previously so will not be reiterated.

Figure 14:
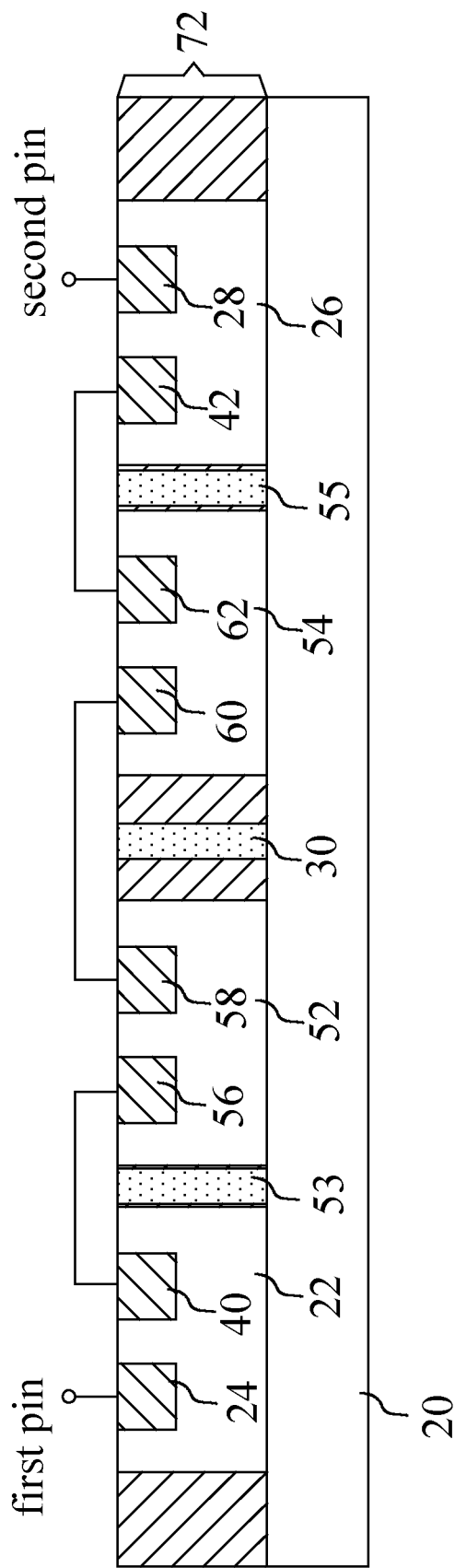
FIG. 14 is a cross-sectional view of a transient voltage suppression device with improved electrostatic discharge (ESD) robustness according to the sixth embodiment of the present invention.

Refer to FIG. 14. The sixth embodiment of the transient voltage suppression device with improved ESD robustness of the present invention is introduced as below. The sixth embodiment is different from the third embodiment in that the first doped well 22, the second doped well 26, the first current blocking structure 30, the at least one third doped well 52, the at least one second current blocking structure 53, the at least one fourth doped well 54, and the at least one third current blocking structure 55 are arranged in an epitaxial layer 72 that is arranged on the semiconductor substrate 20. In the sixth embodiment, the first doped well 22, the second doped well 26, the first current blocking structure 30, the at least one third doped well 52, the at least one second current blocking structure 53, the at least one fourth doped well 54, and the at least one third current blocking structure 55 may contact the semiconductor substrate 20. When the first conductivity type is an N type, the second conductivity type is a P type. In such a case, the equivalent circuit of FIG. 14 is shown in FIG. 10. Even when the epitaxial layer 72 is an N type, P type, or intrinsic and the first doped well 22 and the second doped well 26 are spaced from the semiconductor substrate 20, the semiconductor substrate 20, the epitaxial layer 72, the first doped well 22, and the first heavily-doped area 24 still form the NPN BJT 32 and the semiconductor substrate 20, the epitaxial layer 72, the second doped well 26, and the second heavily-doped area 28 form the NPN BJT 34. When the first conductivity type is a P type, the second conductivity type is an N type. In such a case, the equivalent circuit of FIG. 14 is shown in FIG. 11. Even when the epitaxial layer 72 is an N type, P type, or intrinsic and the first doped well 22 and the second doped well 26 are spaced from the semiconductor substrate 20, the semiconductor substrate 20, the epitaxial layer 72, the first doped well 22, and the first heavily-doped area 24 still form the PNP BJT 36 and the semiconductor substrate 20, the epitaxial layer 72, the second doped well 26, and the second heavily-doped area 28 form the PNP BJT 38. The other technical features have been described previously so will not be reiterated.

In conclusion, the present invention uses the first current blocking structure to suppress the parasitic BJT, thereby enhancing the ESD robustness.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A transient voltage suppression device with improved electrostatic discharge (ESD) robustness comprising:
    a semiconductor substrate having a first conductivity type;
    a first doped well having a second conductivity type, arranged in the semiconductor substrate, and spaced from a bottom of the semiconductor substrate;
    a first heavily-doped area having the first conductivity type and arranged in the first doped well;
    a second doped well having the second conductivity type, arranged in the semiconductor substrate, and spaced from the bottom of the semiconductor substrate;
    a second heavily-doped area having the first conductivity type and arranged in the second doped well; and
    a first current blocking structure arranged in the semiconductor substrate, spaced from the bottom of the semiconductor substrate and arranged between the first doped well and the second doped well, a depth of the first current blocking structure is deeper than or equal to depths of the first doped well and the second doped well, the first heavily-doped area and the second heavily-doped area are respectively electrically connected to a first pin and a second pin, the first current blocking structure is electrically floating, and when an electrostatic discharge (ESD) voltage is applied across the first pin and the second pin, a first electrostatic discharge (ESD) current flows from the first pin to the second pin and flows under the first current blocking structure.

2. The transient voltage suppression device with improved ESD robustness according to claim 1, wherein the first conductivity type is a P type and the second conductivity type is an N type.

3. The transient voltage suppression device with improved ESD robustness according to claim 1, wherein the first conductivity type is an N type and the second conductivity type is a P type.

4. The transient voltage suppression device with improved ESD robustness according to claim 1, wherein the first current blocking structure is a heavily-doped well having the first conductivity type or an isolation trench.

5. The transient voltage suppression device with improved ESD robustness according to claim 1, further comprising:
    a third heavily-doped area having the first conductivity type and arranged in the first doped well; and
    a fourth heavily-doped area having the first conductivity type and arranged in the second doped well, the fourth heavily-doped area is electrically connected to the third heavily-doped area, and the first heavily-doped area and the second heavily-doped area are respectively electrically connected to a first pin and a second pin.

6. The transient voltage suppression device with improved ESD robustness according to claim 5, further comprising at least one third doped well arranged in the semiconductor substrate, spaced from the bottom of the semiconductor substrate, and arranged between the first current blocking structure and the first doped well, the depth of the first current blocking structure is deeper than or equal to a depth of the at least one third well, the at least one third doped well has the second conductivity type and has a fifth heavily-doped area and a sixth heavily-doped area, the fifth heavily-doped area and the sixth heavily-doped area have the first conductivity type, and the third heavily-doped area is electrically connected to the fourth heavily-doped area through the fifth heavily-doped area and the sixth heavily-doped area.

7. The transient voltage suppression device with improved ESD robustness according to claim 6, further comprising at least one second current blocking structure arranged in the semiconductor substrate, spaced from the bottom of the semiconductor substrate, and arranged between the first doped well and the at least one third doped well, and a depth of the at least one second current blocking structure is deeper than or equal to the depths of the first doped well, the second doped well, and the at least one third doped well.

8. The transient voltage suppression device with improved ESD robustness according to claim 7, wherein the at least one second current blocking structure is a heavily-doped well having the first conductivity type or an isolation trench.

9. The transient voltage suppression device with improved ESD robustness according to claim 5, further comprising at least one fourth doped well arranged in the semiconductor substrate, spaced from the bottom of the semiconductor substrate, and arranged between the first current blocking structure and the second doped well, the depth of the first current blocking structure is deeper than or equal to a depth of the at least one fourth well, the at least one fourth doped well has the second conductivity type and has a seventh heavily-doped area and an eighth heavily-doped area, the seventh heavily-doped area and the eighth heavily-doped area have the first conductivity type, and the third heavily-doped area is electrically connected to the fourth heavily-doped area through the seventh heavily-doped area and the eighth heavily-doped area.

10. The transient voltage suppression device with improved ESD robustness according to claim 9, further comprising at least one third current blocking structure arranged in the semiconductor substrate, spaced from the bottom of the semiconductor substrate, and arranged between the second doped well and the at least one fourth doped well, and a depth of the at least one third current blocking structure is deeper than or equal to the depths of the first doped well, the second doped well, and the at least one fourth doped well.

11. The transient voltage suppression device with improved ESD robustness according to claim 10, wherein the at least one third current blocking structure is a heavily-doped well having the first conductivity type or an isolation trench.

12. A transient voltage suppression device with improved electrostatic discharge (ESD) robustness comprising:
    a semiconductor substrate having a first conductivity type;
    an epitaxial layer arranged on the semiconductor substrate;
    a first doped well having a second conductivity type and arranged in the epitaxial layer;
    a first heavily-doped area having the first conductivity type and arranged in the first doped well;
    a second doped well having the second conductivity type and arranged in the epitaxial layer;
    a second heavily-doped area having the first conductivity type and arranged in the second doped well; and a first current blocking structure arranged in the epitaxial layer and arranged between the first doped well and the second doped well, and a depth of the first current blocking structure is deeper than or equal to depths of the first doped well and the second doped well, the first heavily-doped area and the second heavily-doped area are respectively electrically connected to a first pin and a second pin, the first current blocking structure is electrically floating, and when an electrostatic discharge (ESD) voltage is applied across the first pin and the second pin, a first electrostatic discharge (ESD) current flows from the first pin to the second pin and flows under the first current blocking structure.

13. The transient voltage suppression device with improved ESD robustness according to claim 12, wherein the first conductivity type is a P type and the second conductivity type is an N type.

14. The transient voltage suppression device with improved ESD robustness according to claim 12, wherein the first conductivity type is an N type and the second conductivity type is a P type.

15. The transient voltage suppression device with improved ESD robustness according to claim 12, wherein the first current blocking structure is a heavily-doped well having the first conductivity type or an isolation trench.

16. The transient voltage suppression device with improved ESD robustness according to claim 12, further comprising:
a third heavily-doped area having the first conductivity type and arranged in the first doped well; and
a fourth heavily-doped area having the first conductivity type and arranged in the second doped well, the fourth heavily-doped area is electrically connected to the third heavily-doped area, and the first heavily-doped area and the second heavily-doped area are respectively electrically connected to a first pin and a second pin.

17. The transient voltage suppression device with improved ESD robustness according to claim 16, further comprising at least one third doped well arranged in the epitaxial layer and arranged between the first current blocking structure and the first doped well, the depth of the first current blocking structure is deeper than or equal to a depth of the at least one third well, the at least one third doped well has the second conductivity type and has a fifth heavily-doped area and a sixth heavily-doped area, the fifth heavily-doped area and the sixth heavily-doped area have the first conductivity type, and the third heavily-doped area is electrically connected to the fourth heavily-doped area through the fifth heavily-doped area and the sixth heavily-doped area.

18. The transient voltage suppression device with improved ESD robustness according to claim 17, further comprising at least one second current blocking structure arranged in the epitaxial layer and arranged between the first doped well and the at least one third doped well, and a depth of the at least one second current blocking structure is deeper than or equal to the depths of the first doped well, the second doped well, and the at least one third doped well.

19. The transient voltage suppression device with improved ESD robustness according to claim 18, wherein the at least one second current blocking structure is a heavily-doped well having the first conductivity type or an isolation trench.

20. The transient voltage suppression device with improved ESD robustness according to claim 16, further comprising at least one fourth doped well arranged in the epitaxial layer and arranged between the first current blocking structure and the second doped well, the depth of the first current blocking structure is deeper than or equal to a depth of the at least one fourth well, the at least one fourth doped well has the second conductivity type and has a seventh heavily-doped area and an eighth heavily-doped area, the seventh heavily-doped area and the eighth heavily-doped area have the first conductivity type, and the third heavily-doped area is electrically connected to the fourth heavily-doped area through the seventh heavily-doped area and the eighth heavily-doped area.

21. The transient voltage suppression device with improved ESD robustness according to claim 20, further comprising at least one third current blocking structure arranged in the epitaxial layer and arranged between the second doped well and the at least one fourth doped well, and a depth of the at least one third current blocking structure is deeper than or equal to the depths of the first doped well, the second doped well, and the at least one fourth doped well.

22. The transient voltage suppression device with improved ESD robustness according to claim 21, wherein the at least one third current blocking structure is a heavily-doped well having the first conductivity type or an isolation trench.

* * * * *